US011837895B2

(12) United States Patent
Rumbaugh

(10) Patent No.: US 11,837,895 B2
(45) Date of Patent: Dec. 5, 2023

(54) SMART JUMPER CABLES

(71) Applicant: OX PARTNERS, LLC, Wilsonville, OR (US)

(72) Inventor: Scott Rumbaugh, Wilsonville, OR (US)

(73) Assignee: OX PARTNERS, LLC, Wilsonville, OR (US)

( * ) Notice: Subject to any disclaimer, the term of this patent is extended or adjusted under 35 U.S.C. 154(b) by 0 days.

(21) Appl. No.: 17/088,236

(22) Filed: Nov. 3, 2020

(65) Prior Publication Data

US 2021/0135466 A1 May 6, 2021

Related U.S. Application Data

(60) Provisional application No. 62/955,796, filed on Dec. 31, 2019, provisional application No. 62/930,034, filed on Nov. 4, 2019.

(51) Int. Cl.
| | |
|---|---|
| *H02J 7/00* | (2006.01) |
| *F02N 11/14* | (2006.01) |
| *H02J 7/34* | (2006.01) |
| *H01R 11/24* | (2006.01) |
| *H05K 7/00* | (2006.01) |

(52) U.S. Cl.
CPC ............ *H02J 7/0036* (2013.01); *F02N 11/14* (2013.01); *H02J 7/0031* (2013.01); *H02J 7/0047* (2013.01); *H02J 7/342* (2020.01); *H01R 11/24* (2013.01); *H05K 7/005* (2013.01)

(58) Field of Classification Search
CPC ........................................................ H02J 7/00
See application file for complete search history.

(56) References Cited

U.S. PATENT DOCUMENTS

| | | | |
|---|---|---|---|
| 9,124,097 B2 * | 9/2015 | Cruz .................... | H02H 11/002 |
| 2010/0173182 A1 * | 7/2010 | Baxter ................ | H01M 10/488 |
| | | | 429/61 |
| 2010/0283623 A1 | 11/2010 | Baxter et al. | |

FOREIGN PATENT DOCUMENTS

JP          2009-226984          10/2009

* cited by examiner

*Primary Examiner* — Robert Grant
(74) *Attorney, Agent, or Firm* — Schwabe, Williamson & Wyatt, P.C.

(57) ABSTRACT

Embodiments include smart jumper cables for jump-starting a vehicle. A jumper cable is configured with an electronic control module that monitors the connection at each end of the jumper cable, and only closes the circuit when a battery or vehicle electrical system is detected as properly connected to each end. In some embodiments, the electronic control module opens the circuit when a successful jump-start is detected. In some embodiments, the electronic control module further monitors the temperature of the jumper cable, and modulates the power transfer or opens the circuit if the temperature exceeds a predetermined level.

16 Claims, 4 Drawing Sheets

SMART JUMPER CABLES

CROSS-REFERENCE TO RELATED APPLICATIONS

This application claims the benefit of U.S. Provisional Patent Application No. 62/930,034, filed on Nov. 4, 2019 and titled SMART JUMPER CABLES, and U.S. Provisional Patent Application No. 62/955,796, filed on Dec. 31, 2019 and titled SMART JUMPER CABLES. The entire disclosure of both applications are hereby incorporated by reference as if fully stated herein.

TECHNICAL FIELD

This disclosure relates to the field of automotive electrical systems, and specifically to cables that facilitate a safer jump-start process.

BACKGROUND

The vast majority of vehicles powered by an internal combustion engine utilize an electrical system to power various vehicle systems. While the vehicle's engine is running, an alternator or generator is typically driven by the engine to generate the necessary electricity. When the engine is stopped, one or more rechargeable batteries instead supply any needed electricity. The batteries are typically lead-acid, and are optimized to supply a large amount of current in a short time, necessary to start the engine. Once the engine is running, the battery is recharged via the electricity generated by the alternator or generator. If, for various reasons, the battery has an insufficient charge it may not be possible to start the engine, necessitating a jump-start. In a jump-start, the vehicle's electrical system is connected to a second vehicle's electrical system. Electricity then flows from the second vehicle's electrical system, supplementing current from the insufficiently charged battery enough to allow the vehicle to start, and the vehicle's alternator or generator to take over providing electricity.

The background description provided herein is for the purpose of generally presenting the context of the disclosure. Unless otherwise indicated herein, the materials described in this section are not prior art to the claims in this application and are not admitted to be prior art by inclusion in this section.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

DETAILED DESCRIPTION

Figure 1:
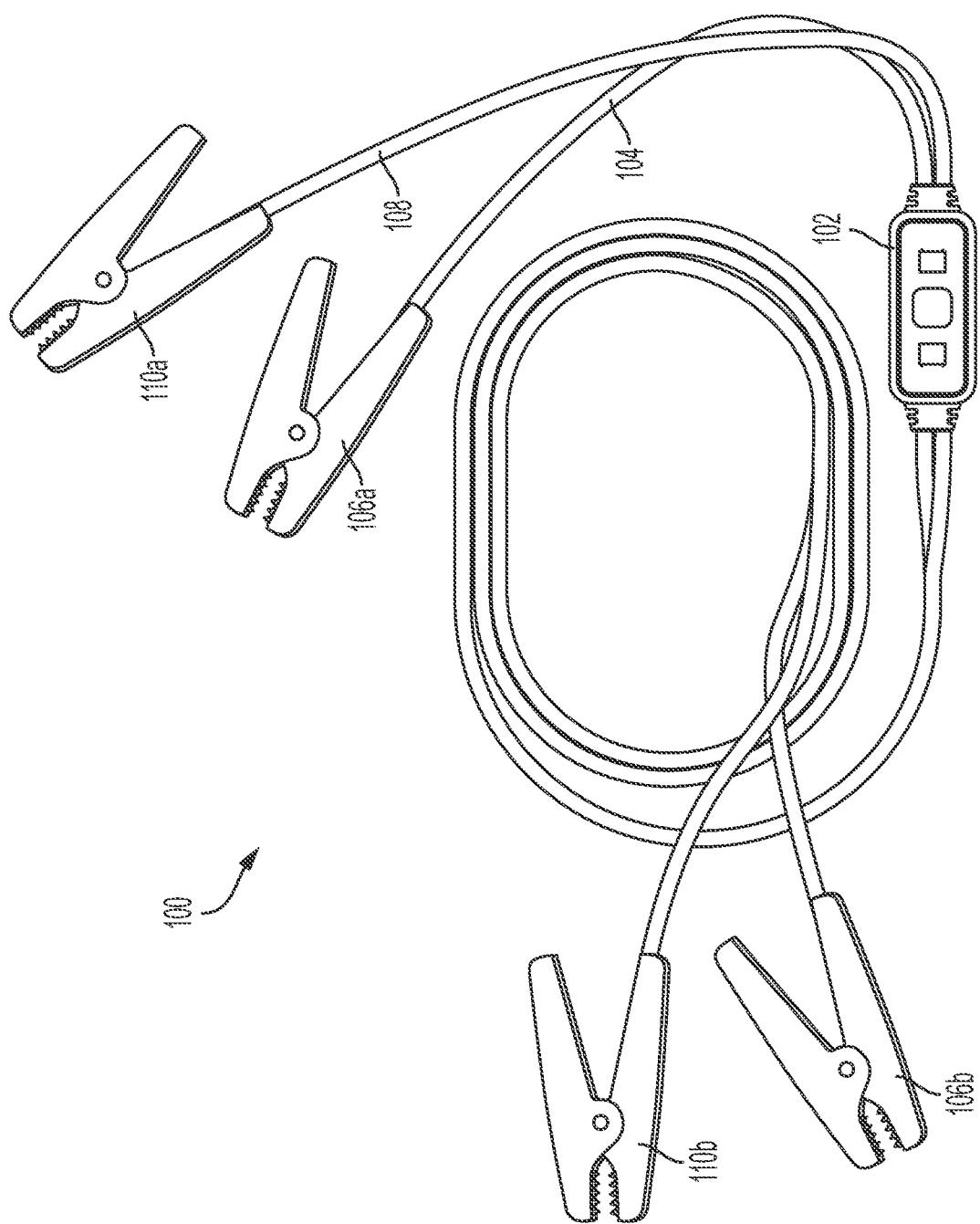
FIG. 1 depicts an example embodiment of a smart jumper cable, according to various embodiments.

In the jump-start process, the electrical system of a vehicle with a battery unable to start the vehicle (referred to herein as the receiving vehicle) is connected in parallel to the electrical system of a vehicle capable of running, with a sufficiently charged battery (referred to herein as the sending vehicle). This effectively ties the electrical systems of the receiving and sending vehicles together, allowing the battery and alternator/generator of the sending vehicle to supply the electricity necessary for the receiving vehicle to start. The connection is typically made using jumper cables, comprised of a pair of conductors with clamps on each end, one conductor for the positive side of the electrical systems, and one conductor for the negative side. A clamp is secured to each conductor, so that each end of the jumper cable has two clamps, one for the negative and one for the positive conductor. The conductors are typically a relatively large gauge wire, sized to handle a relatively short rush of high current when the receiving vehicle starts, and to conduct a current sufficient to start the receiving vehicle.

The typical jump-start procedure involves first connecting one of the clamps on the positive conductor to the positive terminal of the sending vehicle's battery, and connecting the other clamp of the positive conductor to the positive terminal of the receiving vehicle's battery. Next, one of the clamps on the negative conductor is connected to the negative terminal of the sending vehicle's battery. The other clamp of the negative conductor is then typically connected to the negative terminal of the receiving battery or a suitable ground point somewhere on the receiving vehicle, often away from the battery. Typical locations are a metal structure somewhere on the engine, e.g., a cooling hose inlet, engine hoist hook, or exhaust or intake manifold. Once connected, the sending vehicle's engine is typically first started (if not already running) so that the sending vehicle's alternator is helping to supply electricity. Next, the receiving vehicle is then started. Sometimes, the receiving vehicle will not immediately start, particularly when the current demanded by the receiving vehicle during start exceeds the current the jumper cables is capable of transmitting and/or where the sending vehicle cannot supply sufficient current. In such an event, the connection between the sending and receiving vehicle is left in place for a period of time, usually five to ten minutes, to allow the receiving battery to be at least partially charged prior to making additional attempts at starting the receiving vehicle's engine. The partially charged battery on the receiving vehicle can then supplement the current provided by the jumper cables, enabling the receiving vehicle to start. It should be understood that, where the receiving vehicle's battery is typically anticipated to supply at least some of the starting current, the jumper cables need not be large enough to conduct the entire current required by the receiving car during starting. Once the receiving vehicle is started, the jumper cables are removed, typically in reverse order of connection.

In an alternative procedure, both the positive and negative clamps may be connected to the sending vehicle's battery terminals first, followed by the receiving vehicle's positive and negative battery terminals or vehicle's ground point second. When this method is performed, care must be taken to prevent each of the second set of clamps from contacting the other after the first set is connected to the sending vehicle's battery. Inadvertent contact would result in a short circuit, and possible injury or damage to the sending vehicle's battery or electrical system. Other methods of jump-starting may be employed as well.

Connecting jumper cables carries inherent risks. A typical vehicle battery, while usually at a relatively low voltage (typically, 12 VDC nominal for a car battery) and insufficient to cause a shock to the user, is capable of delivering hundreds of amps nearly instantaneously across a load of sufficiently low resistance. Because of this ability to deliver a large current, any short circuit of the battery (such as accidentally touching the clamps at one end of a jumper cables together when the other side is connected to a charged battery) can result in extremely rapid heating of components in the short circuit path, leading to a possible damage to the vehicle, fire, or even a battery explosion. If, in the process of connecting the jumper cables a clamp on an energized positive conductor should contact a grounded negative conductor, a short may occur causing a fire and/or substantial damage to one or both vehicles. Further, cross-connecting the jumper cables, e.g. connecting the positive terminal of the sending car to the negative side of the receiving vehicle and vice-versa, can result in significant damage to one or both of the electrical systems of the sending and receiving vehicles. While jumper cables are typically color-coded to allow readily distinguishing between positive and negative connections, vehicle batteries may not be clearly marked or the markings may be obscured as to positive and negative terminals, providing an opportunity for inadvertent cross-connection.

The large amount of current carried by the jumper cables, even when correctly connected between the sending and receiving vehicle, can also cause the jumper cables themselves to dramatically heat within a relatively short time. If the cables heat sufficiently, the insulation of the jumper cables may break down, again leading to a short. In some instances, the insulation itself may catch fire. For example, the insulation on a typical set of jumper cables is rated to a maximum of 90 degrees C.; once this temperature is reached, the insulation may begin to break down. The amount of time it takes for the insulation to reach this temperature depends at least upon the size of the jumper cable conductors, the type of conductors (e.g. aluminum, copper, or another material), and the amount of current being transferred. This relationship is shown below in Table 1 for various current amounts and wire gauges:

battery when connected but not starting—a 6 gauge aluminum cable will reach 90 degrees C. in just over a minute and a half. This amount of time can easily be exceed if the receiving vehicle's battery is sufficiently depleted so as to require some initial charging prior to attempting a start. Once the receiving vehicle's starter is engaged, the current draw can jump up to several hundred amps. Even at 300 amps, the 6 gauge aluminum cable will reach 90 degrees C. in approximately 10 seconds; less time if the cables have been used to charge the receiving vehicle battery prior to start. As will be understood, if the receiving vehicle is slow to start or otherwise requires a relatively longer crank time, a 6 gauge aluminum jumper cable could easily reach 90 degrees C.

Six gauge jumper cables are a fairly common size. Larger sizes are available that can safely conduct relatively large currents for longer periods of time without overheating. However, if smaller gauge jumper cables are employed, the margin of safety may be substantially less, time-wise. Heat also takes time to dissipate once the current ceases flowing, so repeated short attempts to start can cause a progressive buildup of heat, which can be exacerbated as cable gauge becomes smaller.

Completing a connection with jumper cables also typically results in a spark being generated, such as when the last connection is made. As the clamp approaches the ground lug, the voltage potential between the clamp and lug can reach the breakdown point of the air gap, causing the air to ionize and thus create a spark. Likewise, a spark can occur following a successful jump-start as the jumper cable clamps are removed. As with any spark, this spark can be a source of ignition for any proximate flammable vapors, e.g. fuel from a nearby leaking line, and can result in a fire or explosion. Moreover, a typical lead-acid battery uses a dilute solution of sulfuric acid for an electrolyte, which can generate hydrogen gas via electrolysis in the process of charging or discharging. If a spark occurs proximate to a battery that is emitting hydrogen, e.g. due to improper connection techniques, this hydrogen can explosively ignite, potentially rupturing the battery and spraying sulfuric acid and shrapnel upon any persons nearby (such as the person connecting the jumper cables). In either case, severe personal injury may result. While using a proper connection sequence (detailed above) can reduce the risk of fire, viz. connecting to a ground lug away from the battery of the receiving vehicle last in sequence or disconnecting from the lug first in

TABLE 1

| | Time for temperature to rise from 20° C. to 90° C. (seconds) | | | | | | | | |
|---|---|---|---|---|---|---|---|---|---|
| | Aluminum Cable | | | | | Copper Cable | | | |
| Amps | 10 AWG | 8 AWG | 6 AWG | 4 AWG | 2 AWG | 10 AWG | 8 AWG | 6 AWG | 4 AWG | 2 AWG |
| 100 | 14.55 | 36.79 | 93.01 | 235.15 | 594 | 33.85 | 85.57 | 216.36 | 546.99 | 1382.96 |
| 200 | 3.64 | 9.2 | 23.25 | 58.79 | 148.63 | 8.46 | 21.39 | 54.09 | 136.75 | 345.74 |
| 300 | 1.62 | 4.09 | 10.33 | 26.13 | 66.06 | 3.76 | 9.51 | 24.04 | 60.78 | 153.66 |
| 400 | 0.91 | 2.3 | 5.81 | 14.7 | 37.16 | 2.12 | 5.35 | 13.52 | 34.19 | 86.43 |
| 500 | 0.58 | 1.47 | 3.72 | 9.41 | 23.78 | 1.35 | 3.42 | 8.65 | 21.88 | 55.32 |
| 600 | 0.4 | 1.02 | 2.58 | 6.53 | 16.51 | 0.94 | 2.38 | 6.01 | 15.19 | 38.42 |
| 700 | 0.3 | 0.75 | 1.9 | 4.8 | 12.13 | 0.69 | 1.75 | 4.42 | 11.16 | 28.22 |
| 800 | 0.23 | 0.57 | 1.45 | 3.67 | 9.29 | 0.53 | 1.34 | 3.38 | 8.55 | 21.61 |
| 900 | 0.18 | 0.45 | 1.15 | 2.9 | 7.34 | 0.42 | 1.06 | 2.67 | 6.75 | 17.07 |
| 1000 | 0.15 | 0.37 | 0.93 | 2.35 | 5.95 | 0.34 | 0.86 | 2.16 | 5.47 | 13.83 |

As can be seen from Table 1, even at 100 amps—a typical current draw from a sending vehicle to a receiving vehicle's sequence, it nevertheless does not prevent the formation of a spark. Furthermore, because sparks are typically generated when the cables are disconnected, the same risks exist for the disconnection process as with the connection process.

Disclosed embodiments include a jumper cable equipped with an electronic device to manage the flow of electricity between the sending and receiving vehicles. In embodiments, the device can detect when the cables are connected between the sending and receiving vehicles. The device can hold open the cables, e.g. not allow the circuit to complete, until it detects that both the sending and receiving vehicles are properly connected and even open up the electrical connection automatically after the receiving vehicle has started. By not allowing the circuit to complete or close until proper connection on both sides is detected and possibly opening the circuit following starting of the receiving vehicle, the risk of a short circuit or spark can effectively be greatly reduced or even eliminated, even if a proper connection sequence is not followed. Furthermore, the electronic device can be configured to monitor the flow of current and/or cable temperature to prevent the jumper cable from exceeding its insulation break down temperature, e.g. 90 degrees C., as will be discussed below.

In the following detailed description, reference is made to the accompanying drawings which form a part hereof wherein like numerals designate like parts throughout, and in which is shown by way of illustration embodiments that may be practiced. It is to be understood that other embodiments may be utilized and structural or logical changes may be made without departing from the scope of the present disclosure. Therefore, the following detailed description is not to be taken in a limiting sense, and the scope of embodiments is defined by the appended claims and their equivalents.

Aspects of the disclosure are disclosed in the accompanying description. Alternate embodiments of the present disclosure and their equivalents may be devised without parting from the spirit or scope of the present disclosure. It should be noted that like elements disclosed below are indicated by like reference numbers in the drawings.

Various operations may be described as multiple discrete actions or operations in turn, in a manner that is most helpful in understanding the claimed subject matter. However, the order of description should not be construed as to imply that these operations are necessarily order dependent. In particular, these operations may not be performed in the order of presentation. Operations described may be performed in a different order than the described embodiment. Various additional operations may be performed and/or described operations may be omitted in additional embodiments.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B and C).

The description may use the phrases "in an embodiment," or "in embodiments," which may each refer to one or more of the same or different embodiments. Furthermore, the terms "comprising," "including," "having," and the like, as used with respect to embodiments of the present disclosure, are synonymous.

As used herein, the term "circuitry" may refer to, be part of, or include an Application Specific Integrated Circuit (ASIC), an electronic circuit, a processor (shared, dedicated, or group) and/or memory (shared, dedicated, or group) that execute one or more software or firmware programs, a combinational logic circuit, and/or other suitable components that provide the described functionality.

FIG. 1 illustrates an example embodiment of a smart jumper cable 100. Cable 100 includes an electronics control module 102, a positive conductor 104 which is terminated at either end with a set of connectors, such as positive clamps 106a and 106b, and a negative conductor 108 which is likewise terminated at either end with a set of connectors, such as negative clamps 110a and 110b. As can be seen, electronics control module 102 is interposed between the ends of positive conductor 104 and negative conductor 108. Electronics control module 102, as will be discussed below, acts to close or break continuity between the clamps on either or both of the conductors.

In embodiments, each of the positive conductor 104 and negative conductor 108 is implemented as a large gauge (typically >8 ga.) insulated metallic conductor. The metallic conductor is typically made from a suitable conducting metal such as copper or aluminum, which is surrounded by a suitable insulating material, such as rubber, plastic, silicone, cloth, or another similar flexible and durable dielectric material. For ease of identification, positive conductor 104 may be insulated with insulation that has a distinct visual appearance from the insulation for negative conductor 108. In some embodiments, each conductor may be of a different color, e.g. the positive conductor 104 may be red, while the negative conductor 108 may be black, to match the typical color scheme of a vehicle electrical system.

The size of each conductor is selected according to a maximum rated amperage for a given embodiment of cable 100. As will be understood, comparatively larger gauge conductors are capable of carrying a greater amperage without overheating and risking a fire. Cables 100 that are to be used with larger vehicles, e.g. trucks as opposed to passenger vehicles, and/or high-compression engines such as diesel engines, will typically need to be equipped with larger gauge conductors, such as 4 gauge or larger. Furthermore, cable length may play a factor in gauge selection. As cables 100 increase in length, they increase in resistance and will conduct increasingly lower amounts of amperage. Thus, to achieve a desired current capacity, as the cable 100 gets longer, the conductor gauge may need to be increased. The desired length of the cable 100 may vary depending upon the needs of a given implementation. For relatively light duty cables, e.g. for jumpstarting between passenger cars where batteries may be located near the front of the vehicle, a 6 foot length may be sufficient, while longer cables, e.g. between commercial vehicles where a battery may not be located immediately at the front of the vehicle, a 10 foot or greater length may be required. In some instances, longer cables 100 may be desirable, such as where the sending vehicle cannot be positioned proximate to the receiving vehicle, e.g. with the front ends of each vehicle as close as possible to each other.

The positive conductor 104 includes positive clamps 106a and 106b (collectively or generically, positive clamp 106) attached to each end, and the negative conductor 108 includes negative clamps 110a and 110b (collectively or generically, negative clamp 110) attached to each end. In the depicted embodiment, the positive clamps 106 may be color coded similar to positive conductor 104, and the negative clamps 110 may be color coded similar to negative conductor 108. Each of the positive clamps 106 and negative clamps 110 may be of similar size and construction. Each clamp 106 and 110 may include an outer housing which may be at least partially insulated, which encloses one or more conductive contacts within the clamp jaws. The conductive contacts may be manufactured from a suitable conductive material, such as copper or aluminum. Further, as can be seen in FIG. 1, each contact may be equipped with ridges or teeth to help enhance connection with an uneven surface. The conductive contact of each clamp 106, 110 is electrically secured to the metallic conductor of the positive conductor 104 and negative conductor 108, respectively, such as by a mechanical connection such as swaging or crimping, or by fusing, welding, soldering, or another suitable technique that achieves a reliable electrical connection. Furthermore, the method for electrically securing the metallic conductor to each contact may be selected to regards to the anticipated amount of current to be carried as well as any expected physical stresses the cable 100 may experience in use.

In embodiments, each clamp 106, 110, may be spring-loaded to bias the contacts into a closed position. In use, each clamp may be opened by the user applying pressure to the clamps, allowing the contacts to be slipped over a structure with which electrical contact is to be made, e.g. a battery terminal or lug. The clamp is then released, causing the spring to bias the conductive contacts onto the structure. As with the positive conductor 104 and negative conductor 108, the positive clamps 106 and negative clamps 110 are sized according to the rated current capacity of the implementing cable 100.

Clamps are only one possible embodiment. Other embodiments may employ alternative techniques of or devices for making electrical connections between the sending vehicle's battery and/or electrical system and the receiving vehicle's battery and/or electrical system. For instance, the vehicle's electrical system may be fitted with electrical connectors, such as a shrouded male connection, and the clamps 106 and 110 could be replaced with connectors that mate to the vehicles' electrical connections, such as a shrouded female connection. Any type of connector that allows for a temporary connection of each conductor 104, 108, to each respective vehicle that can handle passing the necessary current to jump-start may be employed.

Figure 2:
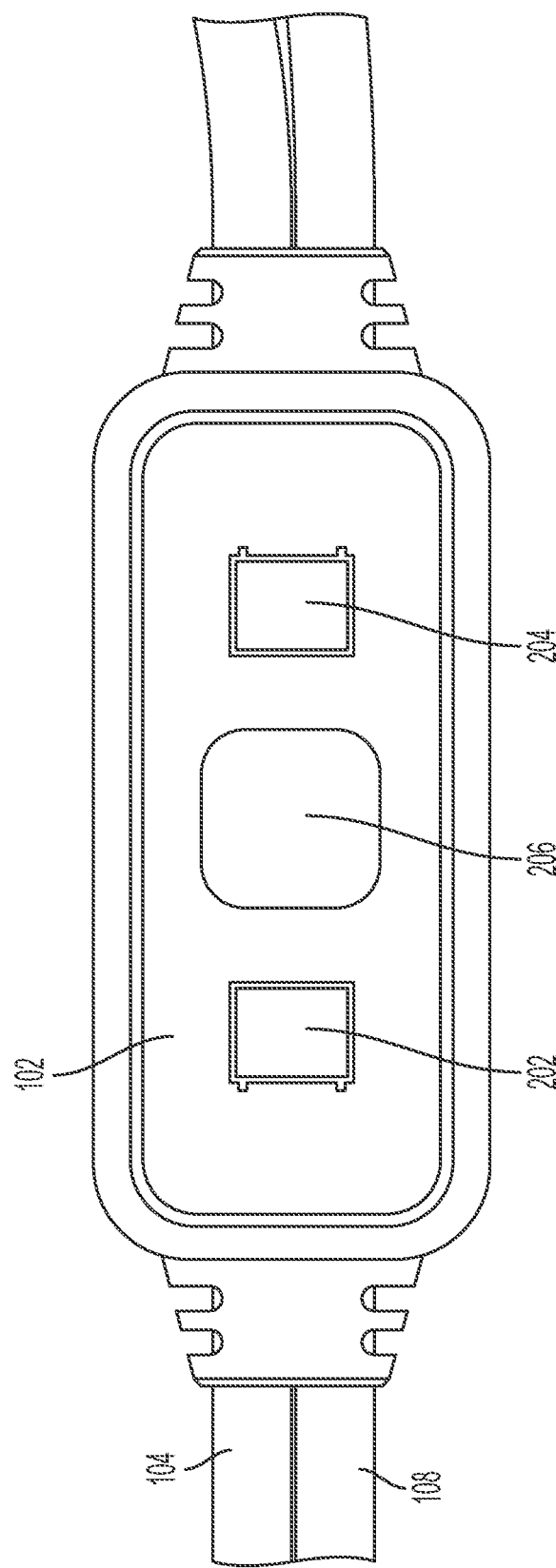
FIG. 2 depicts an example electronics control module interface that may be equipped to a smart jumper cable, such as the smart jumper cable of FIG. 1, according to various embodiments.
Figure 3:
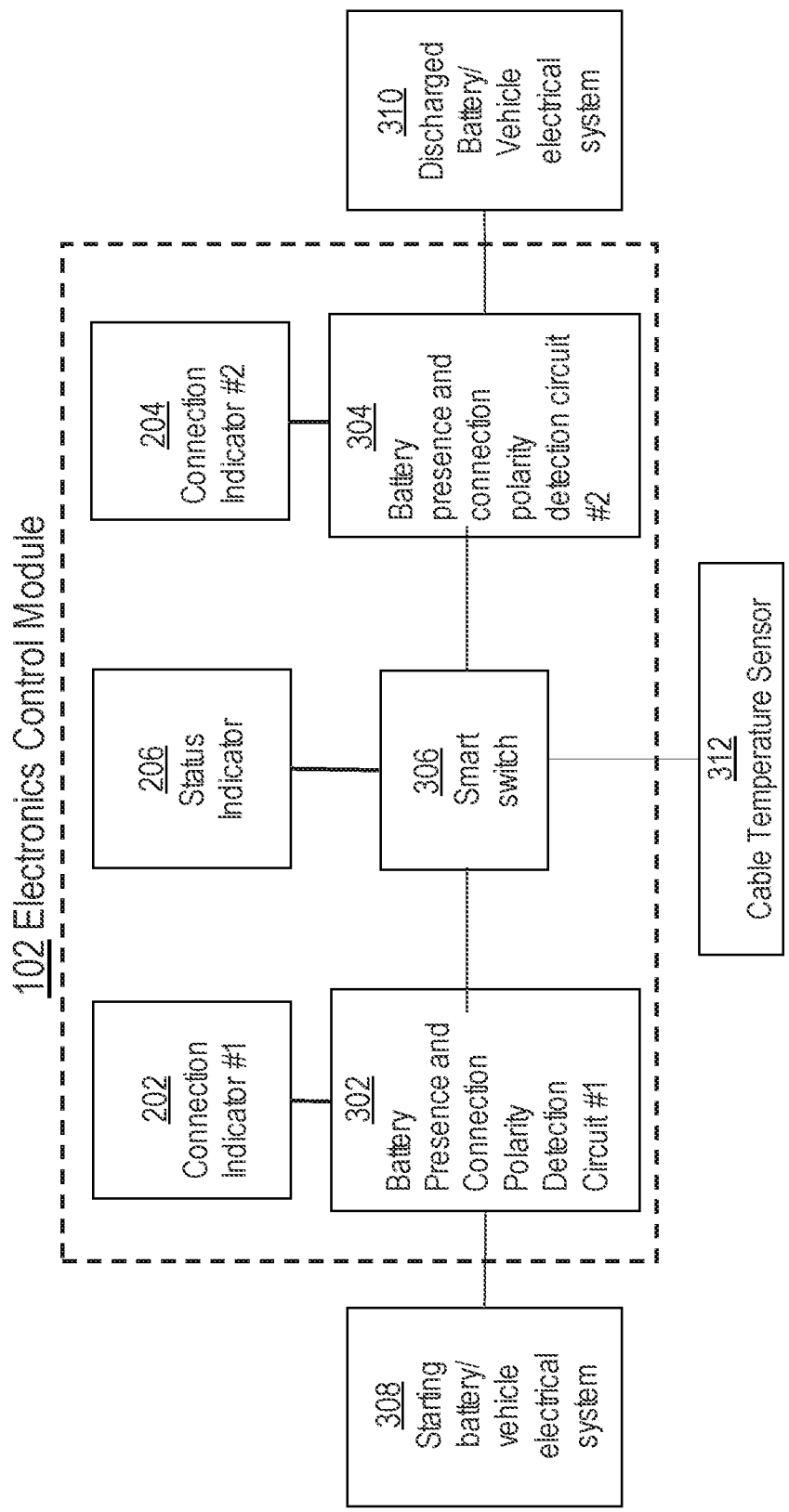
FIG. 3 is a block diagram of the components of an example electronics control module, such as the electronics control module of FIG. 2, according to various embodiments.

FIG. 2 depicts the exterior interface of an example embodiment of the electronics control module 102. Control module 102 may include a first connection indicator 202, a second connection indicator 204, and a status indicator 206 or any combination thereof. Alternatively, other indicators may or may not be present. As can be seen in FIGS. 2 and 3, control module 102 is electrically connected to the positive conductor 104 and negative conductor 108 so as to enable control module 102 to open or close an electrical connection between the respective positive clamps 106a to 106b, and negative clamps 110a to 110b. As will be explained below with respect to FIG. 3, first connection indicator 202 indicates the status of the connection of positive clamp 106a and negative clamp 110a (such as to the sending vehicle's battery), and second connection indicator 204 indicates the status of the connection of positive clamp 106b and negative clamp 110b (such as to the receiving vehicle's battery). Status indicator 206 can indicate the status of the circuit between the sending vehicle and the receiving vehicle, e.g. whether the circuit is open (the vehicles are electrically disconnected from each other) or closed (the vehicles are electrically connected to each other, ready for jump-starting). The indicators 202, 204, and 206 may each be implemented using any suitable indication device, such as an LED, another type of lamp, a mechanical signal such as a flag, or any other suitable signaling device. Where implemented as a lamp such as an LED, the lamp may be configured to display different colors to signal different connection statuses, as will be discussed below. Likewise, a mechanical signal may be configured to display several different types of indications to signal different statuses.

In other embodiments, a manual override switch or device may be supplied, to allow the connection to be manually opened and/or closed by the user. Such a switch may be used by a user to override some or all safety lockouts in some circumstances, such as where the receiving vehicle's battery is too low to register as connected by the electronics control module 102. In embodiments, the status indicator 206 may also be configured as a button to actuate the manual override. In other embodiments, the manual override may be implemented as a separate, discrete control, such as a button or momentary switch.

Turning to FIG. 3, a block diagram of the internal functions of an example electronics control module 102 are depicted. Control module 102 includes a first detection circuit 302 comprised of a battery presence and connection polarity detection circuit, a second detection circuit 304 also comprised of a battery presence and connection polarity detection circuit, and a smart switch 306. The battery presence and connection polarity detection circuits of first detection circuit 302 and second detection circuit 304 may include voltage, current and/or resistance measurement circuitry and may include additional circuitry to analyze data from the measurement circuitry. First connection indicator 202 is in communication with first detection circuit 302, to indicate its status. Second connection indicator 204 is in communication with second detection circuit 304, to indicate its status. Status indicator 206 is in communication with smart switch 306, to indicate its status. In some embodiments, smart switch 306 is also in communication with a cable temperature sensor 312, which could be located inside or outside of the electronics control module 102. In some embodiments, the various indicators 202, 206 and 204 may be in communication with any combination of the other circuits, including first detection circuit 302, second detection circuit 304, smart switch 306, and/or cable temperature sensor 312. In some embodiments, some or all of the indicators 202, 206 or 206 may or may not be present or may be combined in any combination.

In use, first detection circuit 302 is in communication with the sending vehicle. Specifically, first detection circuit 302 connects to the starting battery/vehicle electrical system of the sending vehicle, referred to as the sending vehicle electrical system 308. Likewise, second detection circuit 304 is in communication with the discharged battery/vehicle electrical system of the receiving vehicle, referred to herein as the receiving vehicle electrical system 310. In some embodiments, first detection circuit 302 and second detection circuit 304 are arbitrary designations to illustrate operational principles herein; each detection circuit is configured identically and can be attached to either the sending or receiving vehicle. Thus, for such embodiments it does not matter which side of cable 100 is connected to the sending or receiving vehicle.

Each of the first detection circuit 302 and second detection circuit 304 is configured to detect the presence of a battery attached to its respective clamps 106a/110a, and 106b/110b. In addition to battery presence, each of the first detection circuit 302 and second detection circuit 304 is configured to determine whether an attached battery is hooked up with proper polarity, i.e. positive clamps 106 are connected to positive terminals and negative clamps 110 are connected to negative terminals. Each of the first detection circuit 302 and/or the second detection circuit 304 may detect voltage, polarity, current, resistance and/or other properties of the starting battery/sending vehicle electrical system 308 and/or the discharged battery/receiving vehicle electrical system 310. Each detection circuit may report the status to a user of cable 100 via its associated connection indicator 202, 204. For example, each connection indicator may be dark or unlit when no battery is attached, may display red if a battery is attached but hooked up in reverse polarity, and may display green if a battery is attached properly.

In some embodiments, each connection indicator, the status indicator 206, and/or a separate indicator or set of indicators may include a display indicating the voltage, current, battery resistance, battery health, information related to the readiness to jump start, the status of the electrical systems, whether either vehicle's engine is running and/or any other relevant information. Each detection circuit 302, 304, in embodiments, also communicates the status to smart switch 306 to determine whether to close, open and/or modulate the circuit between the sending and receiving vehicles, as will be discussed below. In addition to connectivity and polarity, the first detection circuit 302 and second detection circuit 304 may also detect the voltage of the connected vehicle electrical system, or if either or both of the electrical connections are shorted, and relay such information to smart switch 306. The battery presence and connection polarity detection circuits, such as first detection circuit 302 and/or second detection circuit 304, may include voltage and/or current and/or resistance measurement circuitry and may include additional circuitry to analyze data from the measurement circuitry.

First detection circuit 302 and second detection circuit 304, as well as smart switch 306, may receive power for operation from one or both of the electrical systems of the sending and/or receiving vehicles and/or an internal battery. First detection circuit 302 and second detection circuit 304 may be implemented using identical or different components, depending upon the needs of a given embodiment. The detection circuits may be implemented using solid-state electronic devices, including integrated circuits as well as discrete components, and/or electromechanical devices, such as relays. It should be understood that, in embodiments, the correlation of either first detection circuit 302 or second detection circuit 304 with the sending and receiving vehicles, respectively, is for illustration purposes only. Either the sending or receiving vehicle can be connected to either of the first detection circuit 302 or second detection circuit 304 while achieving full functionality. In this sense, the cable 100 is agnostic as to which connection is made to the sending vehicle and which connection is made to the receiving vehicle.

Smart switch 306 receives input from first detection circuit 302 and second detection circuit 304, and determines, based upon the input, whether to close or open the circuit between the sending and receiving vehicles. Opening or closing is accomplished by electrically connecting the clamps on each conductor, viz. positive clamp 106a is electrically connected to positive clamp 106b, and negative clamp 110a is electrically connected to negative clamp 110b. Smart switch 306, in some embodiments, may be configured to open or close the circuit using the following basic logic in table 2:

TABLE 2

| First Detection Circuit | Second Detection Circuit | Smart Switch |
| --- | --- | --- |
| Battery is not present/reversed polarity | Battery is not present/reversed polarity | Open |

TABLE 2-continued

| First Detection Circuit | Second Detection Circuit | Smart Switch |
| --- | --- | --- |
| Battery is correctly connected | Battery is not present/reversed polarity | Open |
| Battery is correctly connected | Battery is correctly connected | Closed |

This logic can be expanded via detection of voltage by each of first detection circuit 302 and second detection circuit 304. For example, each detection circuit may be configured to distinguish between when a vehicle is started or stopped by using differential voltages. A battery may be detected if a detection circuit detects a nominal voltage of 12 VDC or less, which would also indicate that the vehicle is not started as the nominal voltage of a vehicle battery is typically 12 VDC or less. The lack of any voltage may indicate that no battery is present, e.g. the clamps connecting to the detection circuit are disconnected or shorted together. Conversely, as the typical vehicle charging system supplies voltage at approximately 13.5 to 15 VDC, detection of a voltage greater than 12 VDC indicates that the vehicle electrical system is not only attached, but that the vehicle is running. With this information, smart switch 106 can be configured to hold the circuit between the sending and receiving vehicles open until the sending car is started, under the following modified logic table, table 3:

TABLE 3

| First Detection Circuit | Second Detection Circuit | Smart Switch |
| --- | --- | --- |
| Battery is not present/reversed polarity | Battery is not present/reversed polarity | Open |
| Battery is correctly connected | Battery is not present/reversed polarity | Open |
| Battery is correctly connected, engine off | Battery is correctly connected, engine off | Open |
| Battery is correctly connected, engine on | Battery is correctly connected, engine off | Closed |
| Battery is correctly connected, engine on | Battery is correctly connected, engine on | Open |

As can be seen, in a configuration using table 3, the smart switch 306 holds the circuit open even after both vehicles are properly connected, and only closes once it detects one of the vehicles, e.g. the sending vehicle, has started its engine. The smart switch 306 can determine that the sending vehicle has started its engine when the voltage exceeds a predetermined threshold, the predetermined threshold being a voltage that would only be present when the vehicle's alternator was operating, thus indicating the engine is running, as discussed above. Table 3 also illustrates an additional possible configuration, namely, that smart switch 306 can reopen the circuit once it detects that the second vehicle, i.e. the receiving vehicle, has also started its engine whether or not the sending vehicle's engine is running. The receiving vehicle starting its engine would indicate a successful jump-start, allowing the cable 100 to automatically break the circuit to help ensure a spark-free disconnection of the clamps 106 and/or 110 from either vehicles' batteries and/or electrical systems.

In some embodiments, smart switch 306 may be agnostic as to whether the clamps 106 and 110 for the positive conductor 104 and negative conductor 108, respectively, are connected to the respective positive and negative battery terminals. In such embodiments, so long as the connection polarity is consistent between the sending and receiving vehicles, smart switch 306 may allow the connection to be closed. Thus, the smart switch 306 may close the connection where clamps 106 are connected to the negative terminals and clamps 110 are connected to the positive terminals (i.e. the red positive conductor 104 is connected between negative terminals and the black negative conductor 108 is connected between positive terminals). In such an embodiment, the detection circuits 302 and 304 may both indicate a reverse polarity, which smart switch 306 will nevertheless allow for connection as closing the circuit will not result in a cross connection. Table 4, below, illustrates polarity-agnostic logic:

TABLE 4

| First Detection Circuit | Second Detection Circuit | Smart Switch |
| --- | --- | --- |
| Battery is not present | Battery is not present | Open |
| Battery is correctly connected | Battery is not present/reversed polarity | Open |
| Battery is not present/reversed polarity | Battery is correctly connected | Open |
| Battery is correctly connected | Battery is correctly connected | Closed |
| Battery is connected with reversed polarity | Battery is connected with reversed polarity | Closed |

Smart switch 306 may also receive information from cable temperature sensor 312, to determine the current temperature of at least a portion of cable 100. Smart switch 306, in embodiments, is configured to open the circuit/break the connection if the sensed temperature of cable 100 exceeds a first predetermined threshold. In some embodiments, smart switch 306 may automatically reclose once cable temperature sensor 312 indicates that the sensed temperature of cable 100 falls below a second predetermined threshold. The first and second predetermined thresholds may be the same or different values. In other embodiments, smart switch 306 may not reclose automatically, instead requiring a user of cable 100 to manually reclose the circuit, such as by pressing a button or similarly suitable toggle. Smart switch 306 may indicate the open condition and/or over-temperature via status indictor 206.

The first predetermined temperature may be a temperature at or below the temperature at which the insulation around cable 100 begins to break down. The second predetermined temperature may be a temperature sufficiently below the first predetermined temperature to prevent a rapid repeating cycle of opening and closing of smart switch 306, depending upon the needs of a given implementation. In some embodiments, the second predetermined temperature is selected on the basis of factors such as the heat dissipation rate of cable 100 and/or typical cranking time. In still other embodiments, the first and second predetermined temperatures may be identical (i.e. only a single predetermined temperature that governs both opening and reclosing).

In some embodiments, the smart switch 306 may open the switch based on, in full or in part, the rate of increase of the cable temperature increase and/or based on a prediction of the maximum cable temperature rise and/or based on the current level passing though the smart switch and/or the amount of time that a current at a certain level has passed through the smart switch 306 and/or cables 108 or 104, or the cumulative amount of current and or power passing through the smart 306 and/or cables 108 or 104, or some other way to keep the cables 108 or 104 within a predicted safe operating temperature.

In some embodiments, the smart switch 306 could open and close with relatively short cycle to regulate the average current passing through the cables to regulate the cable temperature.

In some embodiments, the status indicator 206 may indicate the cable temperature, or provide warnings about the cable temperature.

Cable temperature sensor 312 may be implemented using any suitable technology now existing or later developed, such as a thermistor or thermocouple. Cable temperature sensor 312 may be placed within or in direct contact with the metal conductor or conductors of cable 100, or may be placed within or in contact with the insulation. Smart switch 306 may be calibrated to ensure the insulation remains below its breakdown temperature with respect to the placement of cable temperature sensor 312. In some embodiments, a plurality of cable temperature sensors 312 may be employed to monitor various regions of cable 100. Smart switch 306 may be configured to open if any of the plurality of cable temperature sensors 312 indicates a temperature above the first predetermined temperature. In other embodiments, cable temperature sensor 312 may be placed with regard to the portion or portions of cable 100 most likely to heat the fastest.

Some embodiments may omit cable temperature sensor 312, and instead use a time- or current-based approach to ensuring that cable 100 stays below the insulation breakdown temperature. For example, smart switch 306 may be preprogrammed with the cable's 100 current-temperature profile, such as the time-amp-wire gauge relationships disclosed in Table 1, above. Smart switch 306 may monitor the current flow over time, and open the circuit if the current flow at a given level is sustained for a time equal to or greater than the time required for cable 100 to reach the insulation breakdown temperature for the wire gauge of cable 100.

In still other embodiments, smart switch 306 may be configured to modulate or otherwise restrict current flow upon reaching the insulation breakdown temperature (determined either by direct measurement or inferred from time and current monitoring), rather than opening the circuit. For example, such an approach may be employed where the wire gauge of cable 100 is sufficient to carry enough current to allow at least charging (but possibly not starting) to continue without risk of overheating. Smart switch 306 may also be configured to modulate or otherwise restrict current flow to contain temperature rise. For example, as the temperature of cable 100 increases, smart switch 306 may gradually begin to modulate the current flow, increasing in aggressiveness as the temperature approaches the insulation breakdown temperature.

As seen in FIG. 3, smart switch 306 provides information to status indicator 206. Status indicator 206 may indicate the condition of the connection, e.g. status indicator 206 may be red when the connection is open and an error condition exits (e.g. misconnected cables), turn blue when the cable 100 is properly connected but awaiting starting of the sending vehicle, and turn green when the connection is closed, indicating the sending vehicle is electrically tied to the receiving vehicle, started, and is ready to commence jump-starting. Status indicator 206, in some embodiments, may indicate additional information, such as a fault or overload, e.g. by a different color light or flashing light to indicate an over-current condition, over-temperature condition, battery and/or electrical system voltage anomaly, amperage of current flowing the wrong direction (from the sending vehicle to the receiving vehicle), etc. As discussed above, other information may be conveyed by indicators 202, 204, 206, and/or additional indicators, e.g. numeric or alphanumeric displays, LED bar indicators, etc.

Smart switch 306 may be implemented using solid-state components (such as MOSFETs, integrated circuits, and/or other discrete or integrated components), electromechanical components (such as relays), or a combination of both, as appropriate for a given implementation. As will be understood, the components responsible for closing the circuit between the sending and receiving vehicles are sized to handle the anticipated maximum current transfer between vehicles during jump-starts, in embodiments. Smart switch 306 may be equipped with an over-current and/or over temperature protection device or circuit, such as an electronic breaker, which will automatically open the circuit if an overcurrent and/or over temperature situation is detected. Such a device further can prevent a short-circuit condition, such as if a positive clamp 106 contacted its corresponding negative clamp 110 while the smart switch 106 was closed; the sudden inrush of current from the short would trip the protection device and cause smart switch 306 to immediately open. In embodiments, the protection device may be part of smart switch 306 or implemented as an aspect of smart switch 306's functionality. Alternatively, either or both of the first and second detection circuits 302 and/or 304 could detect the short and provide signal(s) to the smart switch 306 to open. Smart switch 306 may further be implemented using a microcontroller, field-programmable gate array (FPGA), application-specific integrated circuit (ASIC), discrete logic circuits or analog circuits to implement the logic of table 2 and/or table 3, above, and/or other logic. In some implementations, a microcontroller may further include software or firmware to implement some or all of the logic.

In some embodiments, protection against a condition called "load dump" which can damage vehicle electronics can be included in the cables 100. Load dump occurs when a discharged battery is disconnected while the alternator is generating current and can result in large voltage transients which can reach the vehicle electronics. Common techniques for protection against these transients is to use protection devices, such as TVS diodes, diodes and/or varistors, or other protective devices to suppress the transients. Protective devices could be included in the electronics control module 102, or in other parts of the cables 100 to protect against load dump transients. For instance, TVS diodes, diodes, and/or varistors could be used in the battery presence and connection polarity detection circuits, including first detection circuit 302 and/or second detection circuit 304 and/or in the smart switch 306.

Finally, as mentioned above, control module 102 may be equipped with a manual switch or override switch in some embodiments, to allow a user to manually cause the circuit to close in some circumstances. Such a switch may be useful where the receiving car's battery is exhausted to the point where the detection circuit does not register its presence (i.e., reads the battery as disconnected), and so cannot fulfill the logical requirements to cause the smart switch 306 to close automatically. Another possible scenario where a manual override may be desirable is where a user wishes to close the circuit prior to or without starting the sending vehicle's engine. Still another scenario is where the user has reversed polarity on both sides, such that the negative and positive terminals of each vehicle are connected except to the opposite conductor, and the cable 100 is not configured to be polarity-agnostic; manually closing the circuit would be relatively safe, as no cross-connection would result.

Actuation of an override switch notwithstanding, in embodiments, the aforementioned protective devices that detect and prevent a short circuit condition or detect an over temperature condition cannot be circumvented by the override switch. Such a failsafe configuration can prevent a user from creating a dangerous situation by improperly hooking up the cable 100 and forcing a closed circuit with the override switch, or attempting to prematurely reclose the connection when automatically opened due to a sensed over temperature condition. In either scenario, allowing the user to manually close the circuit could result in damage or a fire.

Figure 4:
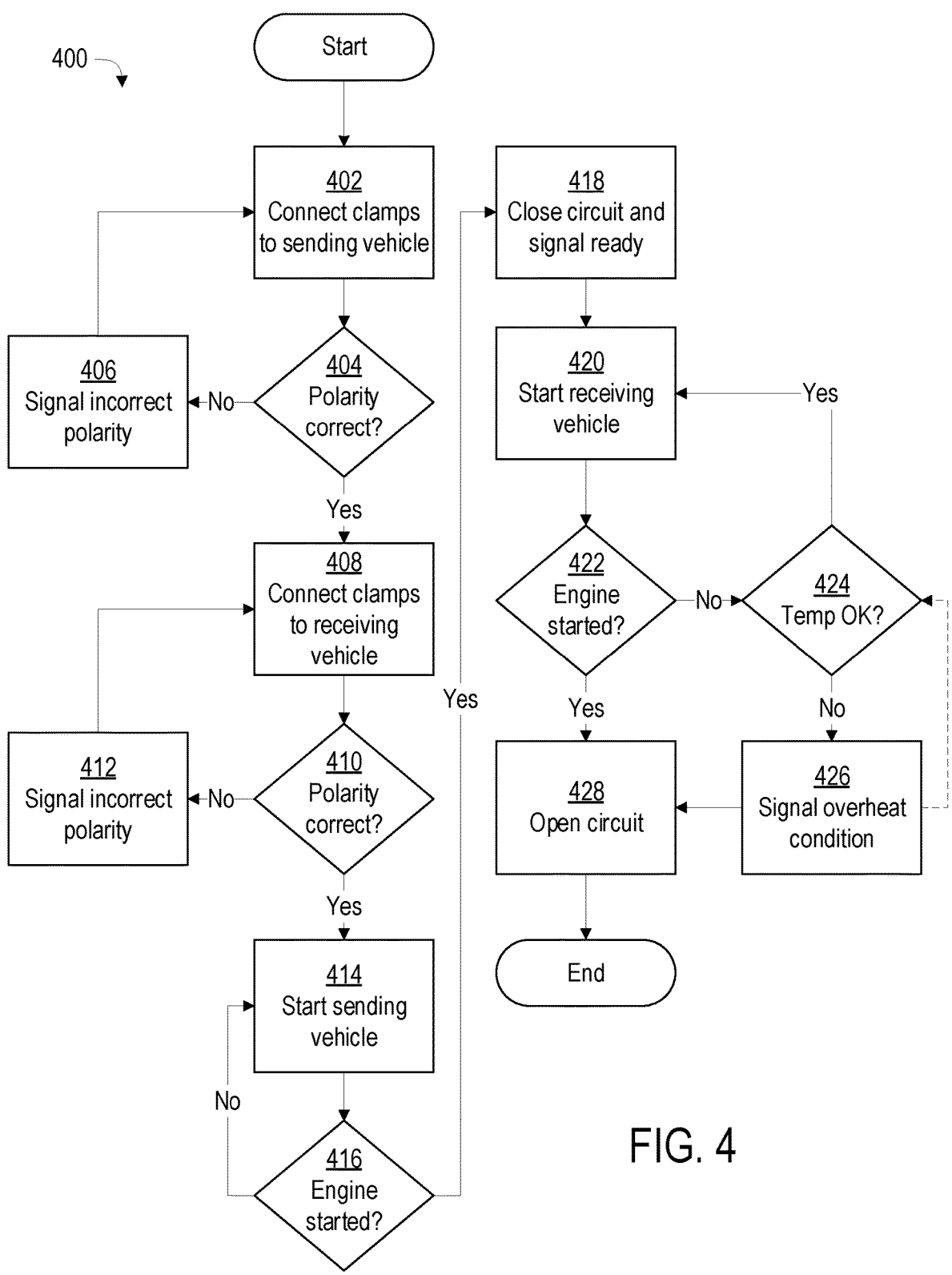
FIG. 4 is a flowchart of operations for jump starting a car with a smart jumper cable, such as the smart jumper cable of FIG. 1, according to various embodiments.

FIG. 4 is a flowchart of an example jump-start procedure 400 that could be executed with a smart jumper cable set, such as cable 100, including logical operations that may be carried out by a control module with a smart switch, such as control module 102. Various operations in procedure 400 may be executed out of order (as appropriate), and some operations may be omitted or additional operations may be added, depending upon the specifics of a given operation.

Starting in operation 402, jumper cable clamps such as clamps 106a, 110a, are connected to the sending vehicle's battery or associated electrical system. Once connected, in operation 404 a control module, such as control module 102 and/or first detection circuit 302, determines if a proper connection has been made. If not (the "No" branch from operation 404), the user may be signaled that the connection is incorrect in operation 406, and the procedure 400 may iterate back to operation 402, and await the clamps being reconnected properly. If a proper connection is made (the "Yes" branch from operation 404), the procedure 400 proceeds to operation 408. The control module may provide an indication of connection status via an indicator, such as first connection indicator 202, which may be green (or an alternative indication) if correctly connected or red (or an alternative indication), if improperly connected. Examples of improper connections can be the lack of a connection or reversed polarity. The unconnected cable clamps are safe from shorting, as the control module holds the circuit open, per logic table 2, 3, or 4.

In operation 408, corresponding clamps, such as clamps 106b, 110b, are connected to the receiving vehicle's battery or associated electrical system. Once connected, in operation 410 the control module determines if a proper connection has been made. If not (the "No" branch from operation 410), the user may again be signaled that the connection is incorrect in operation 412, and the procedure 400 may iterate back to operation 408, to await a proper connection. If a proper connection is made (the "Yes" branch from operation 410), the procedure 400 proceeds to operation 414. As with operation 412, the control module may provide an indication of connection status via an indicator which may be green (or an alternative indication) if correctly connected, or red (or an alternative indication) if the connection is improper.

In operation 414, the sending vehicle is started. In operation 416, the control module confirms that the engine of the sending vehicle has been started. If not (the "No" branch from operation 416), the procedure 400 loops back to operation 414. The control module thus iterates, waiting for the sending vehicle to start. Once started (the "Yes" branch from operation 416), the procedure 400 proceeds to operation 418. However, depending on whether logic table 3 is implemented, a running engine on the sending vehicle may not be a requirement to allow the control module to close the circuit. If not required, operations 414 and 416 may be skipped.

In operation 418, the control module closes the circuit, allowing current to flow from the sending vehicle's battery and/or associated electrical system to the receiving vehicle's discharged battery and/or associated electrical system. Once operation 418 is reached via the "Yes" branches from operations 404, 410, and 416 (if engine start is required per table 3), it will be recognized that all logical conditions required for the control module, and specifically a smart switch, such as smart switch 306, to close the circuit. A status indicator, such as status indicator 206, may indicate that the switch is closed and/or that current is flowing, and/or any other pertinent information if so configured, such as whether either or both of the vehicle's engines are running, the voltage of either or both of the vehicles' batteries or electrical systems is in a suitable range, etc.

In operation 420, the receiving vehicle is started. In operation 422, the control module determines whether the engine of the receiving vehicle has started and if so (the "Yes" branch from operation 422), the procedure 400 proceeds to operation 428. If not (the "No" branch from operation 422), in operation 424 the temperature of the cable is evaluated. If the temperature is within an acceptable range (the "Yes" branch from operation 424), that is, the cable temperature hasn't exceeded a predetermined limit, procedure 400 iterates back to operation 420 and the engine of the receiving vehicle continues to receive power from the sending vehicle, to allow it to continue to be started. If, however, the cable temperature exceeds a predetermined limit, e.g. is outside the acceptable range (the "No" branch from operation 424), procedure 400 proceeds to operation 426.

In operation 426, the cable is overheating, and the current flow may be limited or otherwise modulated depending on the configuration of the control module. If the cable continues to overheat, or if the control module is not configured to limit or modulate the current, procedure 400 may proceed to operation 428.

In operation 428, the control module may automatically open the circuit, such as where table 3 is implemented, in response to either detecting the engine of the receiving vehicle starting (from operation 422) or due to detection of an overheat condition (from operation 426). Alternatively, smart switch 306 may hold the circuit closed until any of the cable clamps are disconnected, resulting in the circuit opening per table 2 or 4.

Following completion of procedure 400, the jumper cable can be disconnected from the sending and receiving vehicles.

It should be understood that, despite the linear stepwise presentation of procedure 400, various operations may operate in parallel, and the stepwise presentation is only for illustration in this disclosure. For example, operations 402-406 may operate in parallel to operations 408-412 and operations 414 and 416. The control module may detect the connection status for the sending and receiving vehicles simultaneously, while also awaiting a signal that the sending vehicle engine has started. While connection of the clamps to the sending vehicle in operation 402 is a prerequisite for detection that the sending vehicle engine has started, the control module nevertheless may monitor for signals of proper connection and engine start simultaneously. Once all three conditions are met, in any order, the control module will then proceed to operation 418, as discussed above. Likewise, operations 422 and 424 may be monitored simultaneously.

For embodiments that employ a polarity-agnostic logic (table 4), operations 404 and 410 may not iterate back to respective operations 402 and 408. Rather, the control module will proceed to operation 418 only if both operations 404 and 410 evaluate either "Yes" or "No", and they do not differ from each other, i.e. one evaluates "Yes" and the other evaluates "No".

It will be apparent to those skilled in the art that various modifications and variations can be made in the disclosed embodiments of the disclosed device and associated methods without departing from the spirit or scope of the disclosure. Thus, it is intended that the present disclosure covers the modifications and variations of the embodiments disclosed above provided that the modifications and variations come within the scope of any claims and their equivalents.

What is claimed is:

1. A cable for jump-starting between two vehicles, comprising:
   a first set of connectors;
   a second set of connectors; and
   an electronic control module in electrical connection with the first and second set of connectors,
   wherein the electronic control module electrically connects the first set of connectors to the second set of connectors when a voltage is detected across the first set of connectors and second set of connectors, and
   wherein the electronic control module gradually begins to modulates the electrical connection in response to a sensed temperature of the cable exceeding a predetermined temperature threshold.

2. The cable of claim 1, wherein the electronic control module is configured to detect when the voltage detected across the first set of connectors is above a predetermined threshold, and electrically connects the first set of connectors to the second set of connectors when the voltage is above the predetermined threshold, and electrically disconnects the first set of connectors from the second set of connectors when the voltage across the first set of connectors is below the predetermined threshold.

3. The cable of claim 2, wherein the electronic control module is configured to detect when the voltage detected across the second set of connectors is above the predetermined threshold, and electrically disconnects the first set of connectors from the second set of clamps when the voltage detected across both the first set of clamps and second set of clamps is above the predetermined threshold.

4. The cable of claim 1, wherein the electronic control module is configured to electrically disconnect the first set of connectors and/or the second set of connectors when the cable temperature exceeds a predetermined threshold.

5. The cable of claim 4, wherein predetermined threshold is a first predetermined threshold, and the electronic control module is further configured to electrically reconnect the first set of connectors to the second set of connectors when the cable temperature falls below a second predetermined threshold.

6. The cable of claim 1, wherein the electronic control module is configured to detect a first polarity of the voltage detected across the first set of connectors and to detect a second polarity of the voltage detected across the second set of connectors, and is further configured to electrically connect the first set of connectors to the second set of connectors when the first polarity matches the second polarity.

7. The cable of claim 1, further comprising a first indicator to indicate a status of the first set of connectors, a second indicator to indicate a status of the second set of connectors, and a third indicator to indicate whether the first set of connectors is electrically connected to the second set of connectors.

8. The cable of claim 7, wherein the first set of connectors comprises a first set of clamps, and the second set of connectors comprises a second set of clamps.

9. The cable of claim 8, wherein the third indicator comprises a button, the button configured to electrically connect the first set of clamps to the second set of clamps regardless of whether a voltage is detected across the first set of clamps or second set of clamps.

10. A method for jump-starting a vehicle using a cable equipped with a control module, comprising:
connecting a first set of connectors to a positive terminal and a negative terminal of a battery of a first vehicle;
connecting a second set of connectors to a positive terminal of a battery of a second vehicle and a negative contact of the second vehicle;
connecting electrically, by the control module, the first set of connectors to the second set of connectors when a first voltage is detected across the first set of connectors and a second voltage is detected across the second set of connectors;
detecting, by the control module, a temperature of the cable; and
modulating, by the control module, a current flow through the cable when the temperature of the cable exceeds a predetermined temperature threshold by gradually limiting the current flow, the limiting increasing in aggressiveness as the temperature rises above the predetermined threshold.

11. The method of claim 10, further comprising:
detecting, by the control module, a polarity of the first voltage; and
detecting, by the control module, a polarity of the second voltage, and
wherein the control module electrically connects the first set of connectors to the second set of connectors only when the first voltage polarity is the same as the second voltage polarity.

12. The method of claim 11, wherein the control module electrically connects the first set of connectors to the second set of connectors when the first voltage exceeds a predetermined threshold.

13. The method of claim 12, further comprising disconnecting electrically, by the control module, the first set of connectors from the second set of connectors when the second voltage exceeds a predetermined threshold.

14. The method of claim 10, further comprising indicating, by the control module, when the first set of connectors is electrically connected to the second set of connectors.

15. A cable for jump-starting between two vehicles, comprising:
a first set of clamps;
a second set of clamps;
a first indicator to indicate a status of the first set of clamps, a second indicator to indicate a status of the second set of clamps, and a third indicator to indicate whether the first set of clamps is electrically connected to the second set of clamps; and
an electronic control module in electrical connection with the first and second set of connectors and configured to electrically connect the first set of clamps to the second set of clamps when a voltage is detected across the first set of clamps and second set of clamps,
wherein the third indicator comprises a button, the button configured to electrically connect the first set of clamps to the second set of clamps regardless of whether a voltage is detected across the first set of clamps or second set of clamps.

16. A cable for jump-starting between two vehicles, comprising:
a first set of connectors;
a second set of connectors; and
an electronic control module in electrical connection with the first and second set of connectors and configured to electrically connect the first set of connectors to the second set of connectors,
wherein the electronic control module is further configured to gradually begin to modulate a current flow through the cable when the temperature of the cable exceeds a predetermined threshold.

* * * * *